United States Patent [19]
Hori

[11] Patent Number: 5,608,354
[45] Date of Patent: Mar. 4, 1997

[54] PHASE-LOCKED LOOP CIRCUIT OBTAINING THE PHASE DIFFERENCE BETWEEN TIME SERIES PULSE STRINGS AND A REFERENCE FREQUENCY

[75] Inventor: Hidetoshi Hori, Tokyo, Japan

[73] Assignee: NEC Corporation, Japan

[21] Appl. No.: 530,838

[22] Filed: Sep. 20, 1995

[30] Foreign Application Priority Data

Sep. 26, 1994 [JP] Japan .................................. 6-229132

[51] Int. Cl.⁶ .................................................. H03L 7/085
[52] U.S. Cl. .......................... 331/1 A; 331/16; 331/17; 331/25; 327/7; 327/12; 327/107; 327/159
[58] Field of Search ............................ 331/1 A, 16, 17, 331/25; 327/2, 5, 7, 12, 105, 107, 156–159; 375/376; 455/260

[56] References Cited

U.S. PATENT DOCUMENTS

| | | | |
|---|---|---|---|
| 4,468,632 | 8/1984 | Crowley | 331/14 |
| 4,876,518 | 10/1989 | Perkins | 331/1 A |
| 5,315,270 | 5/1994 | Leonowich | 331/1 A |

FOREIGN PATENT DOCUMENTS 63-28131   5/1988   Japan .

OTHER PUBLICATIONS

S. Takamatsu, *Nippon Hoso Syuppan Kyokai*, "Understanding of Application Technique of PLL", pp. 20–21, Jul. 1989.

*Primary Examiner*—David Mis
*Attorney, Agent, or Firm*—Ostrolenk, Faber, Gerb & Soffen, LLP

[57] ABSTRACT

A phase-locked loop circuit includes a voltage-controlled oscillator, a pre-scaler, a main counter, a shift register, and a phase comparison section. The oscillation frequency of the voltage-controlled oscillator is controlled on the basis of phase different information. The pre-scaler frequency-divides an oscillation frequency output from the voltage-controlled oscillator by one of frequency division ratios of $1/j$ (j is a positive integer) and $1/(j+1)$ which is selected in accordance with an external control signal. The main counter frequency-divides a frequency division output from the pre-scaler by a frequency division ratio of n (n is a positive integer). The shift register generates $\alpha$ ($\alpha$ is an integer equal to or larger than two) time series pulse strings which are synchronized with the output from the pre-scaler and have phases sequentially delayed by one period on the basis of a frequency division output from the main counter. The phase comparison section detects the phase differences between the $\alpha$ time series pulse strings from the shift register and a predetermined reference frequency signal, adds/synthesizes the detected phase differences, and outputs the resultant information as phase difference information to the voltage-controlled oscillator.

13 Claims, 10 Drawing Sheets

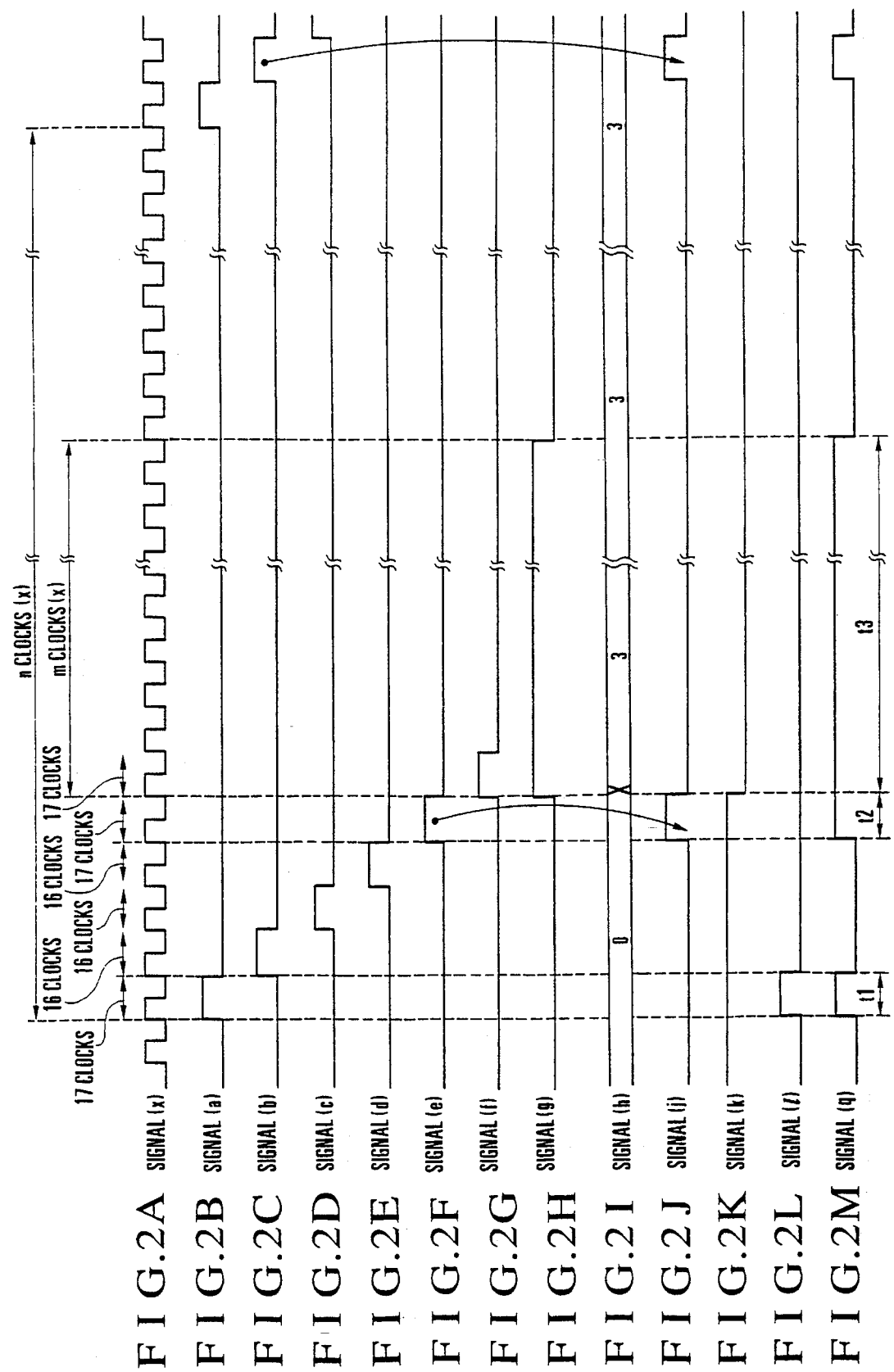

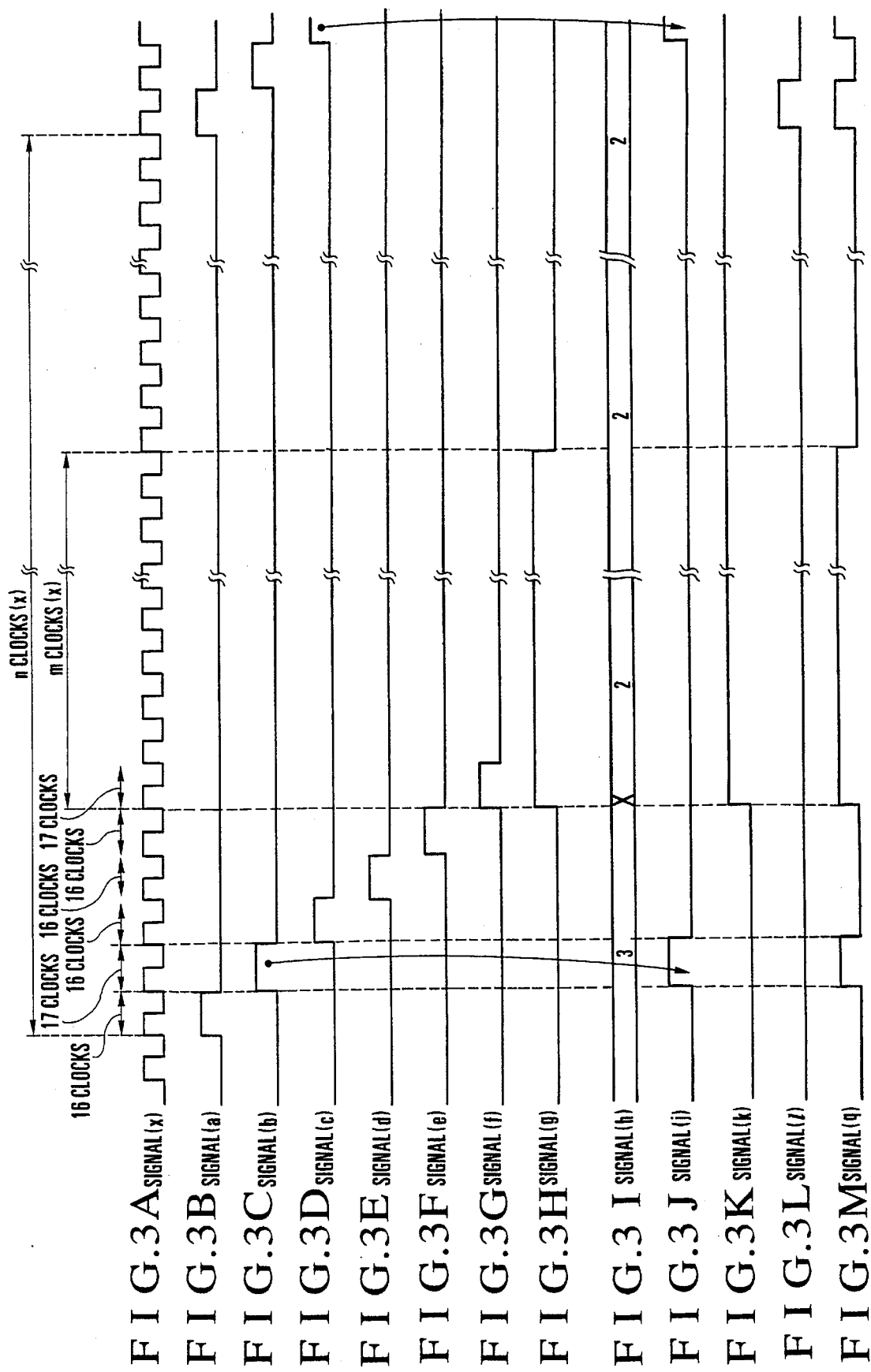

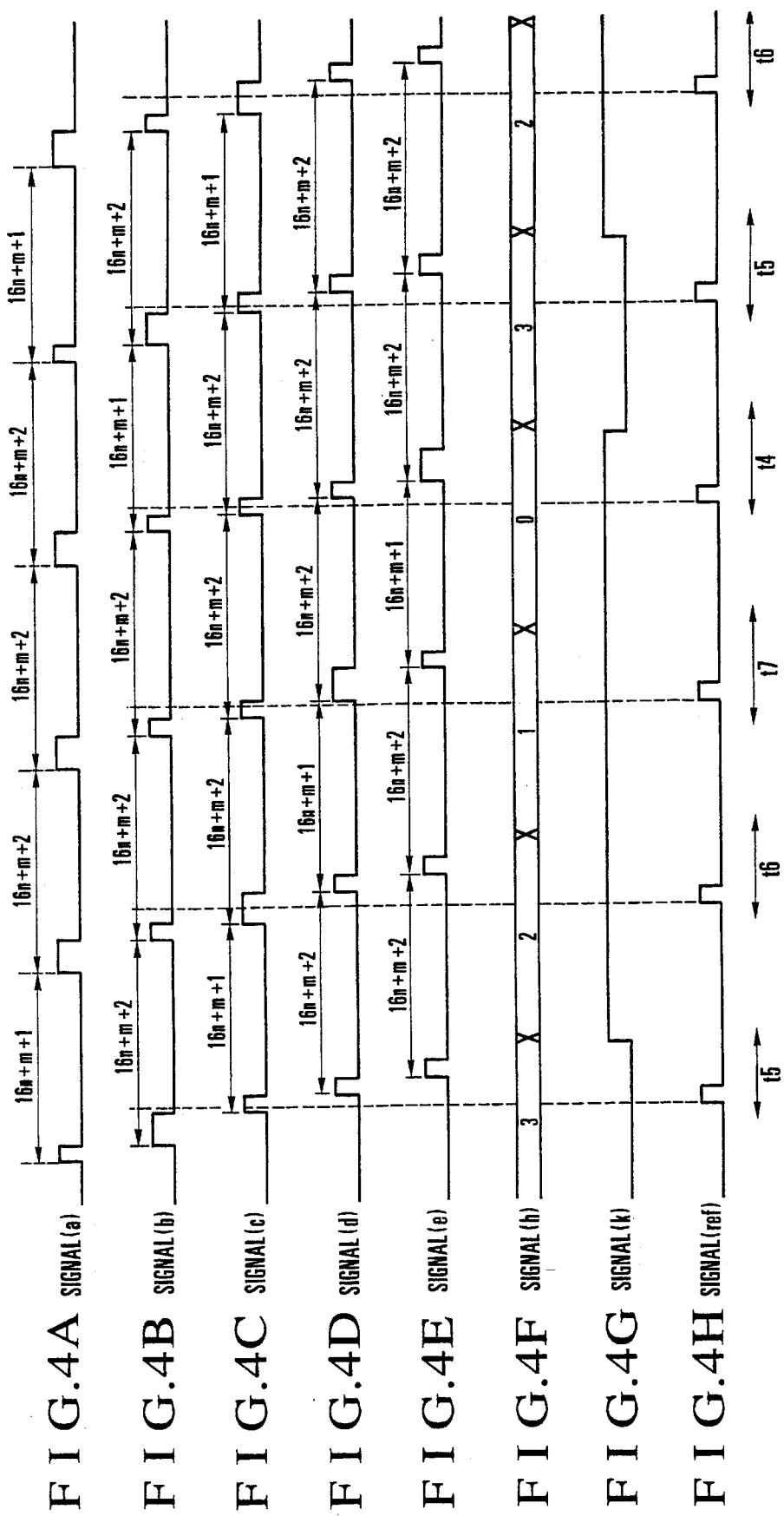

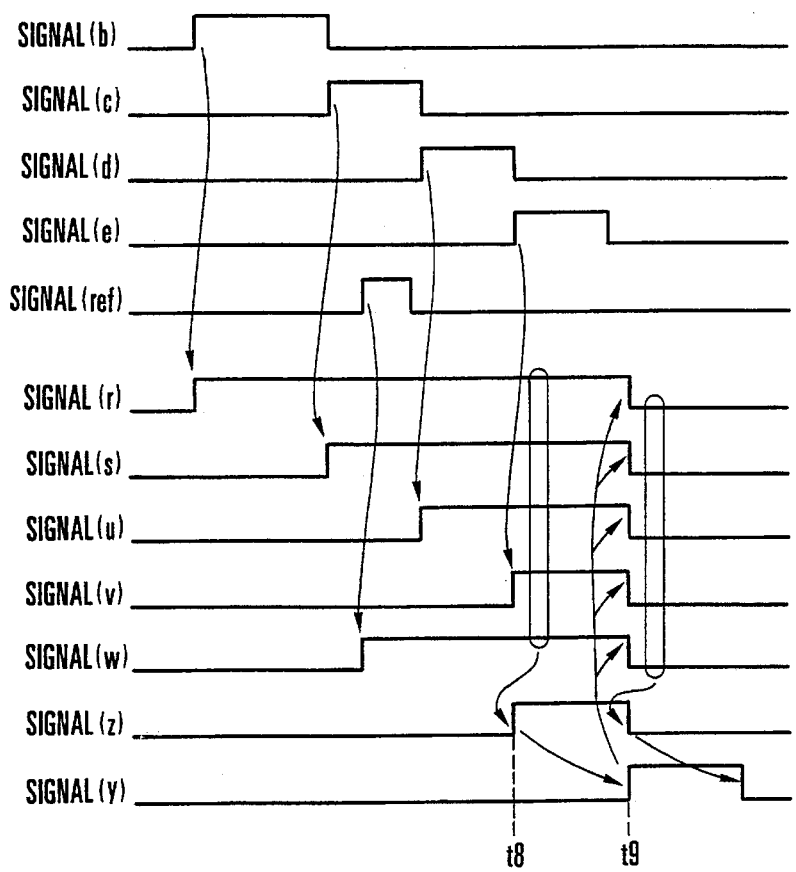
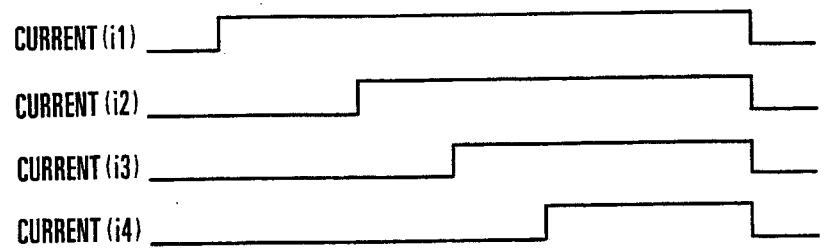
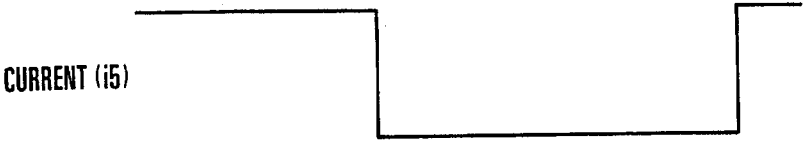
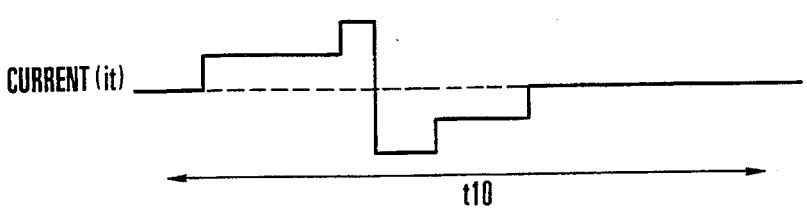

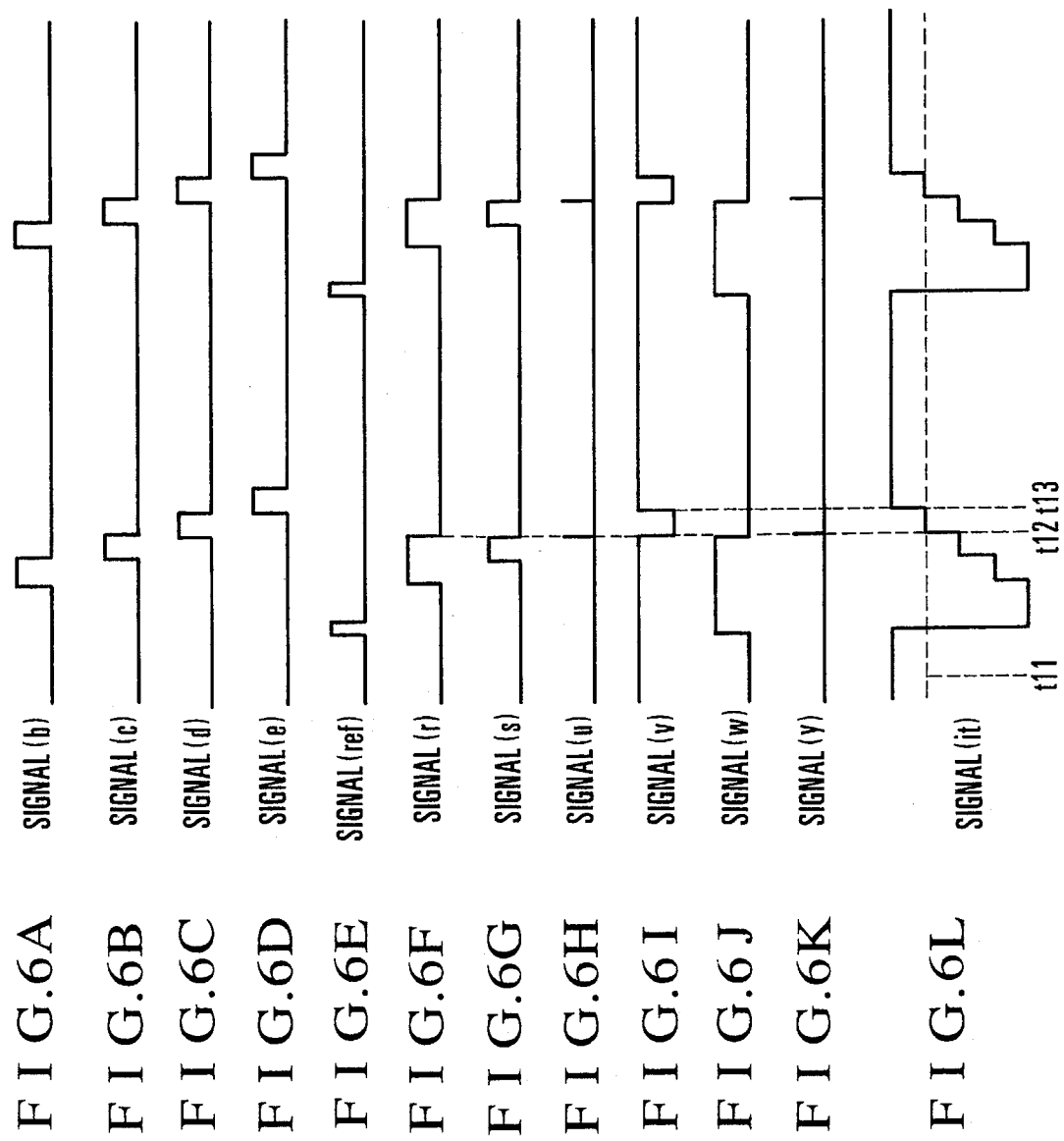

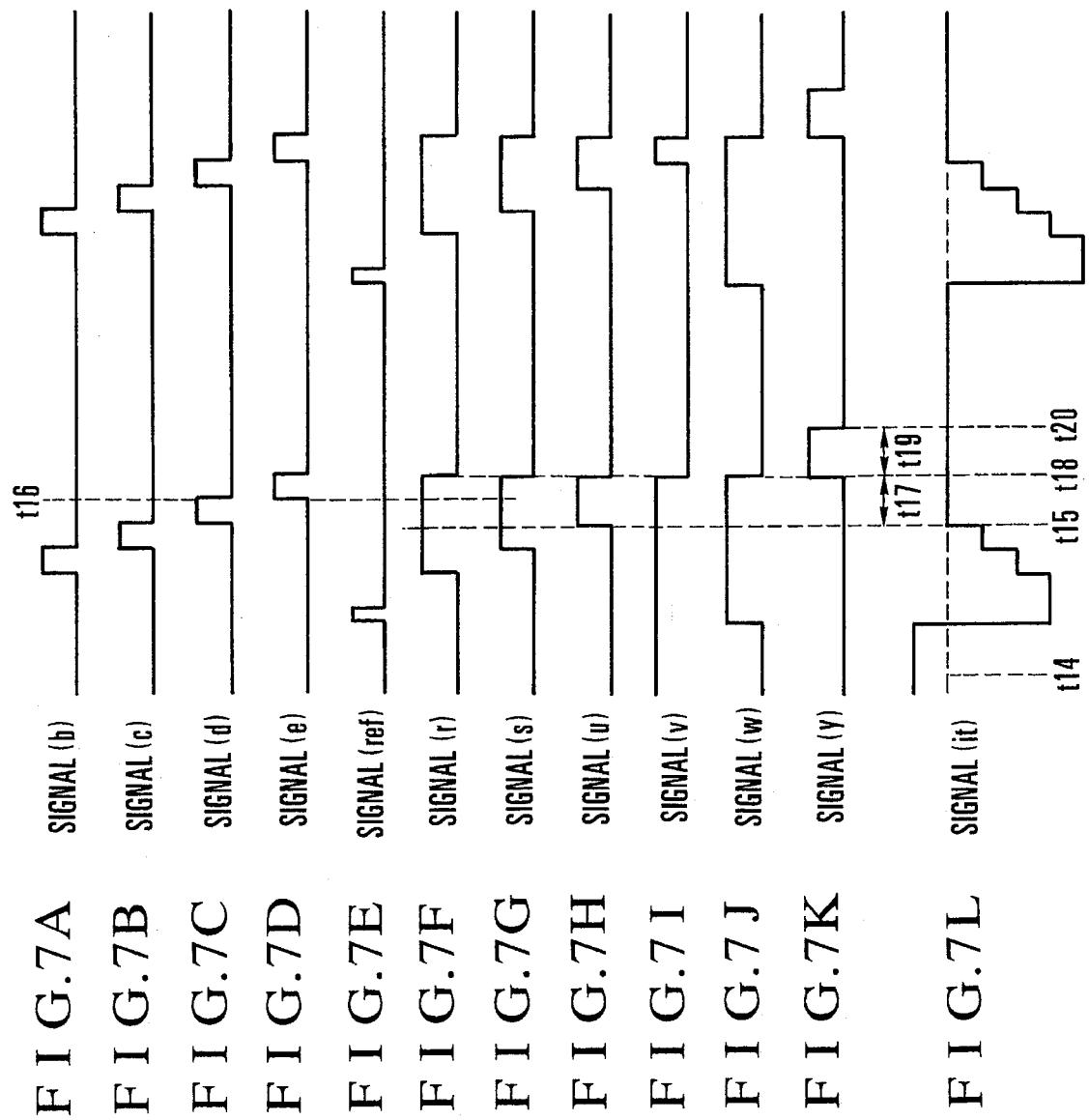

PHASE-LOCKED LOOP CIRCUIT OBTAINING THE PHASE DIFFERENCE BETWEEN TIME SERIES PULSE STRINGS AND A REFERENCE FREQUENCY

BACKGROUND OF THE INVENTION

The present invention relates to a PLL (Phase-Locked Loop) circuit and, more particularly, to a PLL circuit capable of obtaining an oscillation frequency with a small step interval.

In general, a PLL circuit has an arrangement like the one shown in FIG. 9. This PLL circuit includes a VCO (Voltage-Controlled Oscillator) 41 capable of controlling the oscillation frequency in accordance with a control voltage, a frequency divider 42 for frequency-dividing the oscillation frequency of the VCO 41 by a frequency division ratio determined by an external set value, a phase comparator 43 for comparing the phases of the frequency division output and a reference frequency signal with each other to generate phase difference information so as to obtain a control voltage for the VCO 41. Assume that the phase comparator 43 has a filter function for generating a pulse-like signal component every time phase comparison is performed, and extracting a DC component and a low-frequency component near the DC component from the pulse-like signal.

In this PLL circuit, letting 1/k be the frequency division of the frequency divider 42, and fref be the frequency of the reference frequency signal, an output oscillation frequency fosc is given by $$fosc = k \times fref$$

In this case, in consideration of a frequency division value k as an integer, an oscillation frequency with a frequency step interval fref can be obtained by this PLL circuit.

In order to obtain an oscillation frequency with a smaller frequency step interval by using this PLL circuit, the reference frequency fref may be decreased. If, however, the reference frequency fref is decreased, the cutoff frequency of the filter of the phase comparator 43 must also be set low. With a decrease in the cutoff frequency of the filter of the phase comparator 43, the time constant of the filter increases. As a result, it takes time to stabilize the output from the filter. That is, as the frequency step interval of the oscillation frequency obtained by this PLL circuit decreases, the time required for the stabilization of the output oscillation frequency prolongs with respect t6 switching of oscillation frequencies.

FIG. 10 shows a PLL circuit which can solve such a problem. This PLL circuit includes a VCO 51, a first frequency divider 52 for frequency-dividing a frequency signal from the VCO 51, a second frequency divider 53 for further frequency-dividing the signal frequency-divided by the first frequency divider 52, a phase comparator 54 for comparing the phases of the signal frequency-divided by the first frequency divider 52 and a reference frequency signal with each other, a triangular wave generator 55 for generating a triangular wave on the basis of the signal frequency-divided by the second frequency divider 53, and an adder 56 for adding the output signal from the phase comparator 54 to the output signal from the triangular wave generator 55. Note that the adder 56 has a filter for sufficiently blocking a pulse-like signal component generated every time phase comparison is performed.

In this PLL circuit, a signal input to the first frequency divider 52 is frequency-divided by k or (k+j) (j is an integer other than 0) on the basis of a signal frequency-divided by the second frequency divider 53. The frequency-divided signal is input to the phase comparator 54, in which the phase of the signal is compared with that of the reference frequency signal. The signal frequency-divided by the first frequency divider 52 is input to the second frequency divider 53 to be further frequency-divided by s. The signal frequency-divided by the second frequency divider 53 is input to the triangular wave generator 55. In addition, the second frequency divider 53 outputs a switching signal to the first frequency divider 52 at a predetermined timing to switch k-frequency division and (k+j)-frequency division.

The triangular wave generator 55 generates a triangular wave with a period s on the basis of the frequency division signal from the second frequency divider 53. The comparison result from the phase comparator 54 and the triangular wave from the triangular wave generator 55 are added (or subtracted from each other) by the adder 56. With this operation, a fluctuation signal with the period s is removed from the comparison result from the phase comparator 54. An output signal from the phase comparator 54 is then supplied, as a frequency control signal, to the VCO 51.

Assume that in this PLL circuit, the first frequency divider 52 performs (k+1)-frequency division m times and k-frequency division (s−m) times during the period s. The oscillation frequency fosc is then given by $$fosc = fref \times \{k + (m/s)\}$$

As is apparent, an oscillation frequency with a frequency step interval (fref/s) can be obtained. That is, an oscillation frequency with a small frequency step interval can be obtained by using the PLL circuit in FIG. 10 without decreasing the reference frequency fref.

In the method of decreasing the frequency step interval of an oscillation frequency by canceling out a fluctuation component having a long period and included in a phase error signal by using a triangular wave, an error in the triangular wave directly affects the oscillation frequency of the VCO 51, resulting in deterioration in the stability of the oscillation frequency.

SUMMARY OF THE INVENTION

It is an objective of the present invention to provide a PLL circuit which can obtain a stable oscillation frequency with a small frequency step interval without decreasing a reference frequency.

In order to achieve the above objective, the present invention, there is provided a phase-locked loop circuit comprising voltage-controlled oscillation means whose oscillation frequency is controlled on the basis of phase different information, first frequency division means for frequency-dividing an oscillation frequency output from the voltage-controlled oscillation means by one of frequency division ratios of 1/j (j is a positive integer) and 1/(j+1) which is selected in accordance with an external control signal, second frequency division means for frequency-dividing a frequency division output from the first frequency dividing means by a frequency division ratio of n (n is a positive integer), pulse string generating means for generating α (α is an integer equal to or larger than two) time series pulse strings which are synchronized with the output from the first frequency division means and have phases sequentially delayed by one period on the basis of a frequency division output from the second frequency division means, and phase comparison means for detecting phase differences between the α time series pulse strings from the pulse string generating means and a predetermined reference frequency signal, adding/synthesizing the detected phase differences, and outputting the resultant information as phase difference information to the voltage-controlled oscillation means.

BRIEF DESCRIPTION OF THE DRAWINGS

FIGS. 2A to 2M are timing charts showing an example of the frequency-dividing operation of the PLL circuit in FIG. 1;

FIGS. 3A to 3M are timing charts showing another example of the frequency-dividing operation of the PLL circuit in FIG. 1;

FIGS. 4A to 4H are timing charts showing the overall operation of the PLL circuit in FIG. 1;

FIGS. 5A to 5R are timing charts showing an example of the phase comparing operation of the PLL circuit in FIG. 1;

FIGS. 6A to 6L are timing charts showing another example of the phase comparing operation of the PLL circuit in FIG. 1;

FIGS. 7A to 7L are timing charts showing still another example of the phase comparing operation of the PLL circuit in FIG. 1;

DESCRIPTION OF THE PREFERRED EMBODIMENT

Figure 1:
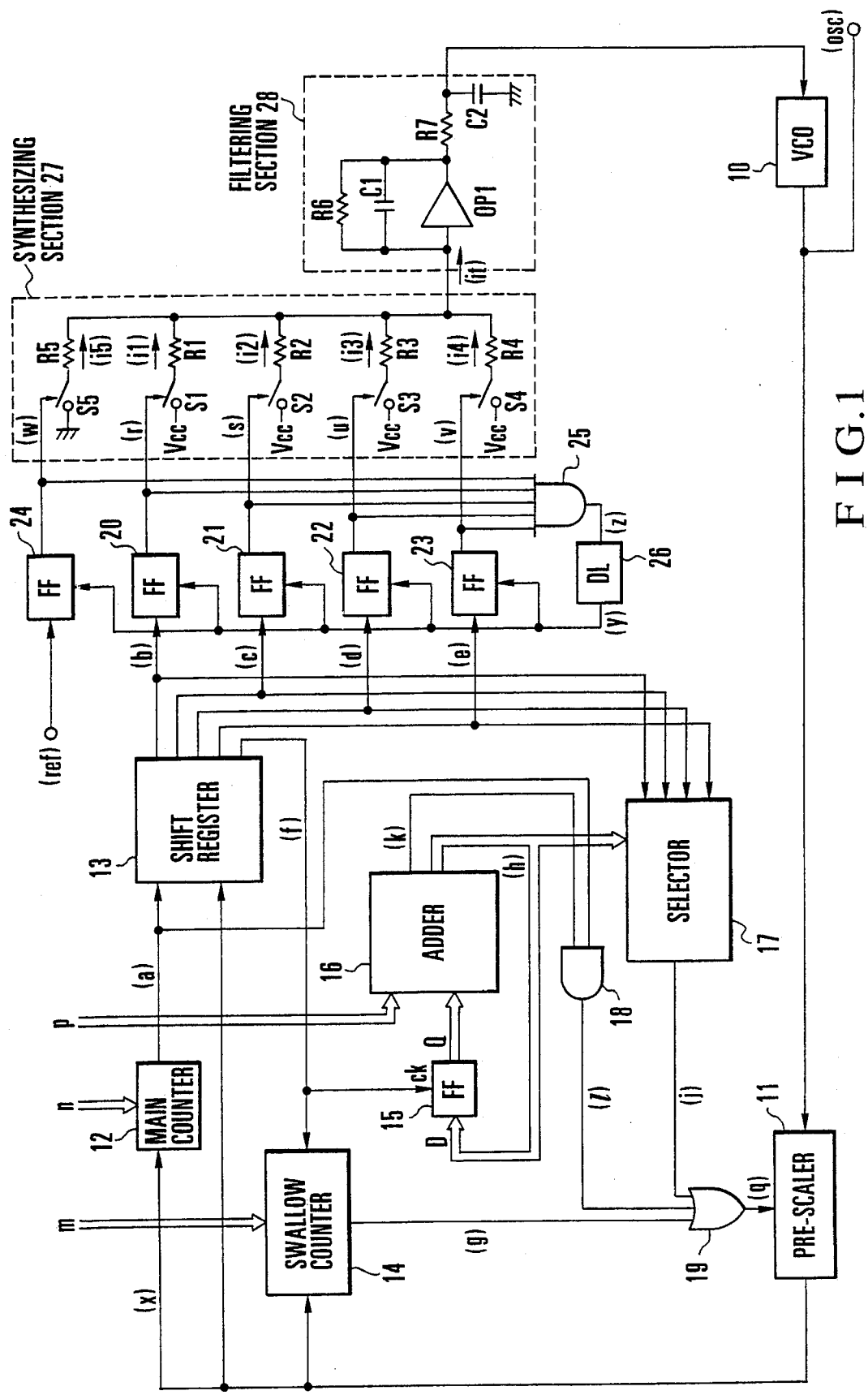
FIG. 1 is a circuit diagram showing a PLL circuit according to an embodiment of the present invention.

FIG. 1 shows a PLL circuit according to an embodiment of the present invention. The PLL circuit in FIG. 1 includes a voltage-controlled oscillator 10, a pre-scaler 11, a main counter 12, a shift register 13, a swallow counter 14, a flip-flop (FF) 15, an adder 16, a selector 17, an AND gate 18, an OR gate 19, flip-flops (FFs) 20 to 24, an AND gate 25, a delay unit 26, a synthesizing section 27, and a filtering section 28.

The operation of the PLL circuit of this embodiment will be described below with reference to FIGS. 1 to 7. Assume that in the embodiment, the flip-flop 15 and the adder 16 can handle 2-bit numerical values.

The operation of the PLL circuit in FIG. 1 in which, for example, a set value p input to the adder 16 is given as p=3, and the initial output value from the first flip-flop 15 is "1" will be described with reference to the timing charts in FIGS. 2A to 2M. FIGS. 2A to 2M respectively show an output (x) from the pre-scaler 11, an output (a) from the main counter 12, delayed outputs (b) to (f) from the shift register 13, an output (g) from the swallow counter 14, an addition output (h) from the adder 16, an output (j) from the selector 17, a carry signal (k) from the adder 16, an output from (l) from the AND gate 18, and an output (q) from the OR gate 19.

The pre-scaler 11 frequency-divides an oscillation frequency signal from the VCO 10 by j (j is a positive integer), e.g., 16, and outputs the resultant signal. Upon reception of a frequency division control signal from the OR gate 19, the pre-scaler 11 outputs the signal (x) obtained by frequency-dividing the oscillation frequency signal by (j+1), e.g., 17 (FIG. 2A).

In accordance with a set value n (n is a positive integer), the main counter 12 outputs the signal (a) obtained by further frequency-dividing the signal (x) from the pre-scaler 11 by n (FIG. 2B).

The shift register 13 is constituted by (α+1) (α is an integer equal to or larger than two) (five (α=4) in this embodiment) series-connected flip-flops. The shift register 13 outputs the signals (b) to (f) obtained by delaying the input signal (a) from the main counter 12 by one to five output clocks (x) from the pre-scaler 11 (FIGS. 2C to 2G).

The swallow counter 14 starts to count pulses in response to the signal (f), which is delayed by five clocks and output from the shift register 13, as a start timing, and outputs the signal (g) having a width m in accordance with a set value m (m is a positive integer; n−5>m) (FIG. 2H). The output signal (g) from the swallow counter 14 is supplied, as a control signal for causing the pre-scaler 11 to perform 17-frequency division, to the pre-scaler 11 via the OR gate 19 (timing t3).

The adder 16 adds a latch output value from the flip-flop 15 and a set value p (p is 0 to 3 in this case (0 to α−1 in general)), and outputs the addition result output value (h) and the carry signal (k) indicating an overflow (FIGS. 2I and 2K). If the set value p input to the adder 16 is given as p=3, and the output value from the flip-flop 15 is "1", the addition result output value (h) from the adder 16 is "0", and the carry signal (k) is set at high level.

The selector 17 has received the addition result output value (h) from the adder 16 and the signals (b) to (e) respectively delayed by one to four clocks (x) and output from the shift register 13. When the addition result output value (h) from the adder 16 is "3", "2", "1", or "0", the selector 17 selects and outputs the signal delayed once, the signal delayed twice, the signal delayed three times, or the signal delayed four times accordingly. Referring to FIG. 2J, since the addition result output value (h) is "0", the selector 17 selects the signal (e), which is delayed four times and output from the shift register 13, and outputs the signal (j). The output signal (j) from the selector 17 is supplied, as a control signal for causing the pre-scaler 11 to perform 17-frequency division, to the pre-scaler 11 via the OR gate 19 (timing t2).

The AND gate 18 outputs the logical AND (l) between the carry signal (k) from the adder 16 and the signal (a) from the main counter 12 (FIG. 2L). The output signal (l) from the AND gate 18 is supplied, as a control signal for causing the pre-scaler 11 to perform 17-frequency division, to the pre-scaler 11 via the OR gate 19 (timing t1).

The OR gate 19 outputs the logical OR (q) between the signal (g) from the swallow counter 14, the signal (j) from the selector 17, and the signal (l) from the AND gate 18 (FIG. 2M).

In the above timing intervals t1, t2, and t3, the pre-scaler 11 performs 17-frequency division. That is, the pre-scaler 11 performs 17-frequency division (m+2) times and 16-frequency division (n−m−2) times while the main counter 12 performs n-frequency division once. Consequently, the number of clocks, of the oscillation frequency signal from the VCO 10, required for the main counter 12 to perform n-frequency division is 17×(m+2)+16×(n−m−2)=(16n+m+2).

The flip-flop 15 latches and outputs the addition result output value (h) which is output from the adder 16 and input to the D terminal at the timing of the signal (f) which is delayed five times and output from the shift register 13. For this reason, the output value from the Q terminal of the flip-flop 15 changes from "1" to "0" at the timing of the signal (f) which is delayed five times and output from the shift register 13.

The operation of the PLL circuit in FIG. 1 in a case wherein the output value from the flip-flop 15 changes to "0" will be described with reference to the timing charts in FIGS. 3A to 3M. FIGS. 3A to 3M correspond to FIGS. 2A to 2M, respectively, and a detailed description thereof will be omitted.

Since the output value from the flip-flop 15, which is input to the adder 16, is "0", the addition result output value (h) output from the adder 16 and shown in FIG. 3I becomes "3", and the carry signal (k) in FIG. 3K is set at low level. Since the addition result output value (h) is "3", the selector 17 selects and outputs the signal (b) in FIG. 3C, which is delayed by one clock (x) and output from the shift register 13 (FIG. 3J). In addition, since the carry signal (k) is at low level, the output signal (l) is not generated by the AND gate 18 (FIG. 3L).

Referring to the timing charts in FIGS. 3A to 3M, the pre-scaler 11 performs 17-frequency division (m+1) times and 16-frequency division (n−m−1) times while the main counter 12 performs n-frequency division. Consequently, the number of clocks, of the oscillation frequency signal from the vc0 10, required for the main counter 12 to perform n-frequency division is $17 \times (m+1) + 16 \times (n-m-1) = (16n+m+1)$.

Note that the output value from the Q terminal of the flip-flop 15 changes from "0" to "3" at the timing of the signal (f) which is delayed by five clocks and output from the shift register 13.

FIGS. 4A to 4H respectively show an output (a) from the main counter 12, signals (b) to (e) which are respectively delayed by one to four clocks (x) and output from the shift register 13, an addition result output value (h) from the adder 16, a carry signal (k), and a reference frequency signal (ref). Referring to FIGS. 4A to 4H, the operation in a timing interval t4 corresponds to the operation described with reference to FIGS. 2A to 2M, and the operation in a timing interval t5 corresponds to the operation described with reference to FIGS. 3A to 3M.

It is, therefore, easily understood from a description similar to that made with reference to FIGS. 2A to 2M and FIGS. 3A to 3M that the addition result output value (h) from the adder 16 periodically changes like "0"→"3"→"2"→"1", and is restored to the initial state.

In addition, as is apparent, with periodic changes in the addition result output value (h) from the adder 16, the leading edge of each of the signals shown in FIGS. 4A to 4E, i.e., the output (a) from the main counter 12 and the signals (b) to (e) which are respectively delayed by one to four clocks (x) and output from the shift register 13, repeats at nonuniform time intervals, i.e., an interval of (16n+m+2) clocks repeats three times after an interval of (16n+m+1) clocks, when counted with clocks output from the VCO 10.

In addition, the nonuniform repetitive phases of the signals (b) to (e) which are respectively delayed by one to four clocks (x) and output from the shift register 13 are different from each other.

FIGS. 4B to 4E and 4H also show the time relationship between the reference frequency signal (ref) and the signals (b) to (e) which are respectively delayed by one to four clocks (x) and output from the shift register 13 in a case wherein the VCO 10 of the PLL circuit of this embodiment is normally operated at a frequency $\{(16n+m+1)+(16n+m+2) \times 3\} \times \frac{1}{4} = (64n+4m+4+3)/4$ times the reference frequency signal (ref).

FIGS. 5A to 5R explain the operation of the PLL circuit of this embodiment in the timing interval t5 in FIGS. 4A to 4F. FIGS. 5A to 5R respectively show delayed outputs (b) to (e) from the shift register 13, a reference frequency signal (ref), outputs (r) to (w) from the flip-flops 20 to 24, an output (z) from the AND gate 25, an output (y) from the delay unit 26, currents (i1 to i5) respectively flowing in semiconductor switches S1 to S5, and a synthetic current (it) of the currents (i1 to i5).

The signals (b) to (e) which are respectively delayed by one to four clocks (x) and output from the shift register 13 are respectively connected to the flip-flops 20 to 23. The flip-flops 20 to 23 are set at the timings of the leading edges of the respective time series signals of the signals (b) to (e) in FIGS. 5A to 5D, which are respectively delayed by one to four clocks (x) and output from the shift register 13, and the resultant signals (r) to (v) are output (FIGS. 5F to 5I).

Meanwhile, the reference frequency-signal (ref) in FIG. 5E is input to the flip-flop 24. The flip-flop 24 is set at the timing of the leading edge of the signal (ref), and the resultant signal (w) is output (FIG. 5J).

The signals (r) to (w) from the flip-flops 20 to 24 are input to the AND gate 25. The AND gate 25 detects that all the outputs from the flip-flops 20 to 24 are set, and outputs a set detection signal (z) indicated by a timing t8 (FIG. 5K).

The delay unit 26 receives and delays the set detection signal (z) by a predetermined period of time, and outputs a reset signal (y) indicated by a timing t9 (FIG. 5L). The flip-flops 20 to 24 are reset in response to this reset signal (y).

The outputs (r) to (w) from the flip-flops 20 to 24 are also output to the synthesizing section 27. The synthesizing section 27 is constituted by semiconductor switches S1 to S5 and resistors R1 to R5. The switches S1 to S5 are respectively connected to the flip-flops 20 to 24 and turned on when the respective flip-flops are set.

In the PLL circuit of this embodiment, the resistance of each of the resistors R1 to R4 is set to be four times the resistance of the resistor R5 in consideration of the current balance. That is, the magnitude of a current flowing in the semiconductor switch S5 in an ON state is four times that of a current flowing in each of the semiconductor switches S1 to S4 in an ON state. In addition, the semiconductor switches S1 to S4 and the semiconductor switch S5 are connected to a power supply such that currents flow in opposite directions.

In accordance with the signals (r) to (w) from the flip-flops 20 to 24, the currents (i1) to (i5) in FIGS. 5M to 5Q flow in the semiconductor switches S1 to S5, respectively. Therefore, the current (it) obtained by synthesizing the currents (i1) to (i5) flowing in the semiconductor switches S1 to S5 is output as a phase error signal (FIG. 5R).

As is apparent from FIGS. 5M to 5Q, while the PLL circuit of this embodiment is normally operated, the sum of the quantities of electricity (magnitudes of currents × durations of currents) of the current flowing in the semiconductor switches S1 to S4 and the quantity of electricity of the current flowing in the semiconductor switch S5 cancel out each other, and hence the quantity of electricity of the resultant phase error signal (it) in FIG. 5R is 0.

Similarly, it is easily understood that while the PLL circuit of this embodiment is normally operated in the timing intervals t4, t6, and t7, the quantity of electricity of the phase error signal (it) output from the synthesizing section 27 is 0.

If the PLL circuit of this embodiment has a phase error with respect to the above normal operation, the quantity of electricity of the resultant phase error signal (it) becomes a positive or negative value.

The phase error signal obtained in this manner includes no fluctuation component originating from the nonuniformity (in terms of time series) of the signals (b) to (e) which are respectively delayed by one to four clocks and output from the shift register 13. This means that the cutoff frequency of the high-pass filter of the filtering section 28 connected to the output side of the synthesizing section 27 can be set to be high.

An increase in the cutoff frequency of the filter leads to a decrease in the time constant of the filter. That is, the time required for the stabilization of the oscillation frequency of the PLL circuit of this embodiment can be shortened.

The phase error signal (it) output from the synthesizing section 27 is input to the filtering section 28. The filtering section 28 includes an operational amplifier OP1, resistors R6 and R7, and capacitors C1 and C2. The filtering section 28 is designed to sufficiently smooth the fluctuation component of the phase error signal (it) and provide an appropriate time constant for the PLL circuit of the present invention.

According to the above description, in the PLL circuit of this embodiment, if the 2-bit set value p input to the adder 16 is given as p=3, the oscillation frequency fosc is given as follows, with respect to the frequency fref of the reference frequency signal:

$$fosc = fref(64n+4m+4+3)/4$$

If, however, the 2-bit set value p input to the adder 16 is given as p=0 to 3, the oscillation frequency fosc of the PLL circuit of this embodiment is given by $$fosc = fref(64n+4m+4+p)/4 \qquad (1)$$

As a result, the oscillation frequency step interval is given as (fref/4).

More specifically, in the PLL circuit of this embodiment, the first frequency divider frequency-divides the oscillation output from the VCO by a frequency division ratio of j or (j+1), the second frequency divider further frequency-divides the resultant frequency division output by a frequency division ratio of n, and $\alpha$ time series pulse strings which are synchronized with the first frequency division output and are sequentially shifted in phase are generated on the basis of the second frequency division output. The phase differences between these time series pulse strings and the reference frequency signal fref are respectively detected and added/synthesized to obtain a control voltage for the VCO. With this operation, a high-resolution oscillation output with a step interval fref/$\alpha$ smaller than that of the reference frequency signal fref can be obtained.

In general, if the frequency division ratio of the pre-scaler 11 is j or (j+1) (16 or 17 in this embodiment), and the number of output terminals of the shift register 13, i.e., the number of the time series pulse strings (b) to (e), is $\alpha$ (four in this embodiment), general equation (1) is rewritten into $$fosc = fref(j\alpha n + \alpha m + \alpha + p)/\alpha \qquad (2)$$
$$= fref(jn + m + 1 + p/\alpha)$$

where p is an integer from 0 to $\alpha-1$.

As is apparent from general equation (2), the oscillation frequency with the frequency step interval (fref/$\alpha$) can be obtained. As is apparent from FIG. 1, in equation (2), the values n, m, and p are parameters which can be externally set. If this PLL circuit is used for the frequency synthesizer of a radio communication unit, these parameters n, m, and p are to be changed/controlled in accordance with channel setting.

If the values n, m, and p are controlled such that the value p changes first from 0 to $\alpha-1$, and the values m and n then change sequentially, the output frequency fosc sequentially changes at the frequency step intervals of (fref/$\alpha$), thereby allowing fine channel switching.

The PLL circuit of this embodiment has been described with reference to FIGS. 1 to 5R. The operation of the delay unit 26 will be described next with reference to FIGS. 6A to 6L and FIGS. 7A to 7L. FIGS. 6A to 6L respectively show delayed outputs (b) to (e) from the shift register 13, a reference frequency signal (ref), outputs (r) to (w) from the flip-flops 20 to 24, an output (y) from the delay unit 26, and a synthetic current (it) of currents (i1 to i5) flowing in the semiconductor switches S1 to S5. FIGS. 7A to 7L correspond to FIGS. 6A to 6L, respectively.

FIGS. 6A to 6L show a case wherein the delay amount of the delay unit 26 is not sufficient. FIGS. 7A to 7L show a case wherein the time delay amount of the delay unit 26 is appropriate.

Referring to FIGS. 6F to 6J, if the flip-flop 23 has already been set at a timing t11 in the case wherein the time delay amount of the delay unit 26 is not sufficient, all the flip-flops 20 to 24 are set at a timing t12.

The AND gate 25 detects the set states of all the flip-flops 20 to 24 and outputs a set detection signal. Since the time delay amount is not sufficient, the delay unit 26 outputs the reset signal (y) in FIG. 6K at an early timing (e.g., immediately after the timing t12) in response to the input set detection signal. This reset signal (y) resets all the flip-flops 20 to 24.

If this reset signal (y) is output before a timing t13, the flip-flop 23 is set in accordance with the leading edge of the signal (e) in FIG. 6D, which is generated at a timing t13, delayed four times, and output from the shift register 13, as shown in FIG. 6I.

FIG. 6L shows the phase error signal (it) output from the synthesizing section 27 while the PLL circuit of this embodiment in FIG. 1 is performing the above normal operation. In the operation state shown in FIGS. 6A to 6L, since the semiconductor switches S1 to S5 are kept ON for a long period of time, the phase error signal output from the synthesizing section 27 is susceptible to the influences of the power supply voltage. The oscillation frequency signal therefore becomes unstable.

Referring to FIGS. 7F to 7J, if the flip-flop 23 has already been set at a timing t14 in the case wherein the time delay amount of the delay unit 26 is appropriate, all the flip-flops 20 to 24 are set at a timing t15.

The AND gate 25 detects the set states of all the flip-flops 20 to 24, and outputs a set detection signal. Since the time delay amount is appropriate, the delay unit 26 delays the input set detection signal, and outputs the reset signal (y) in FIG. 7K at, e.g., a timing t18. This reset signal (y) resets all the flip-flops 20 to 24 at a timing t19.

If the leading edge of the signal (e) which is delayed by four clocks (x) and output from the shift register 13 is in a timing interval t17, the flip-flop 23 is kept in the set state, as shown in FIGS. 7D and 7I. If the leading edge of the signal (e) which is delayed by four clocks and output from the shift register 13 is in a timing interval t19, the flip-flop 23 is kept in the reset state.

When the time delay amount of the delay unit 26 of the PLL circuit of this embodiment in FIG. 1 is appropriate, a stable operation can be expected even in a case wherein the operation is started in an initial state indicated by a timing t14, because the operation of the PLL circuit shifts to the operation described with reference to FIGS. 5A to 5R.

Figure 8:
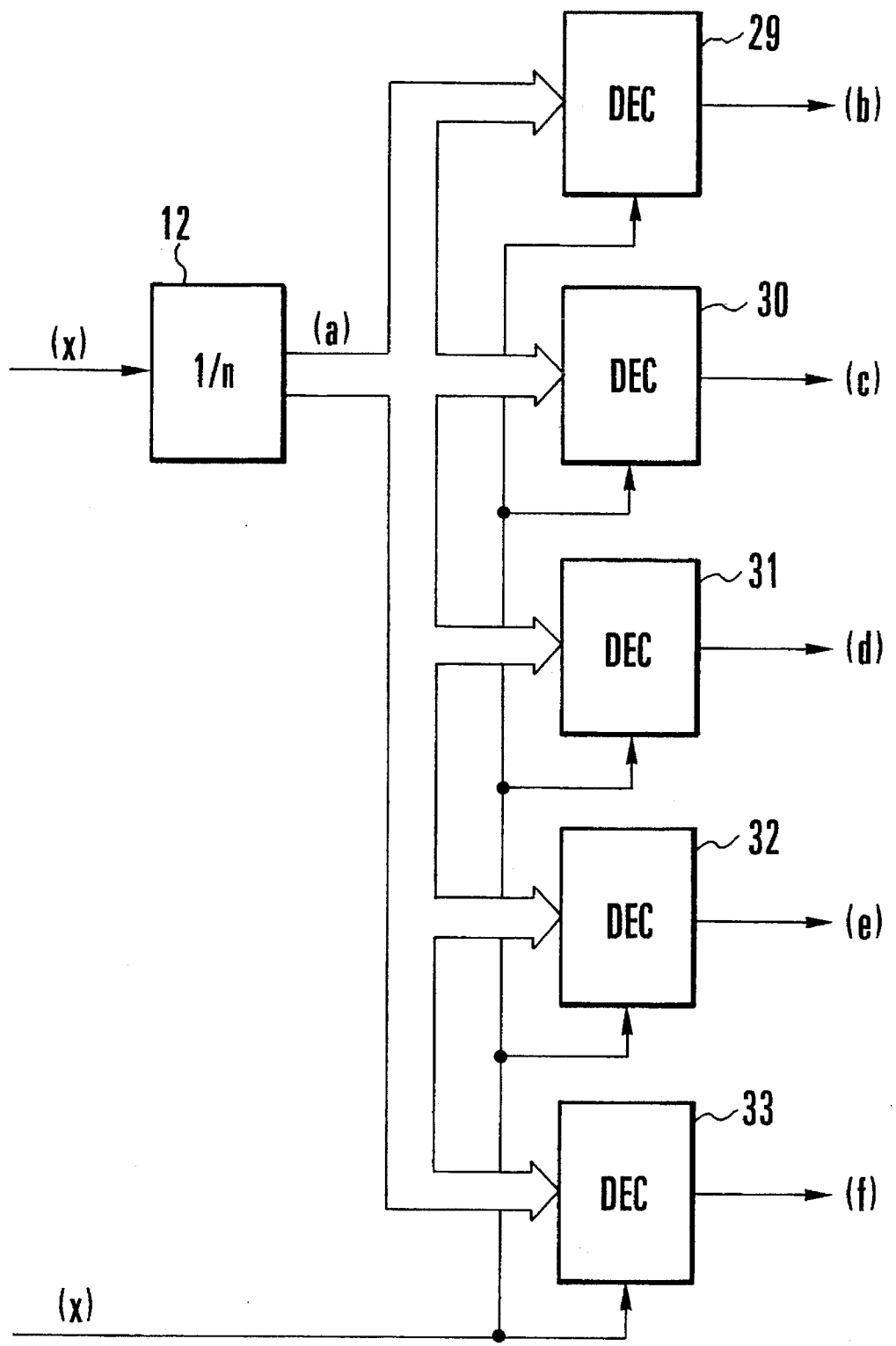
FIG. 8 is a block diagram showing another circuit for generating a plurality of time series pulse strings.
Figure 9:
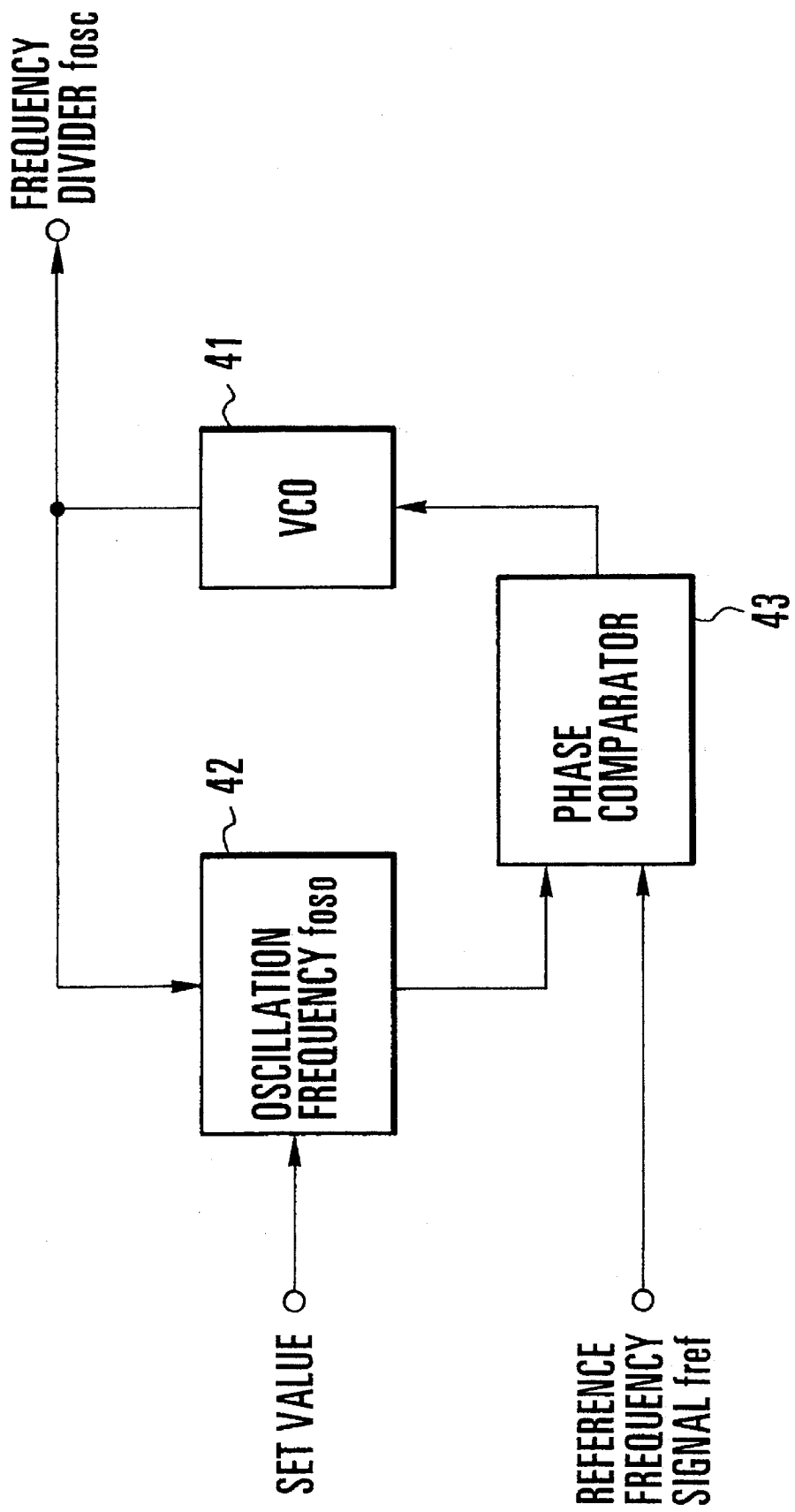
FIG. 9 is a block diagram showing a conventional PLL circuit.
Figure 10:
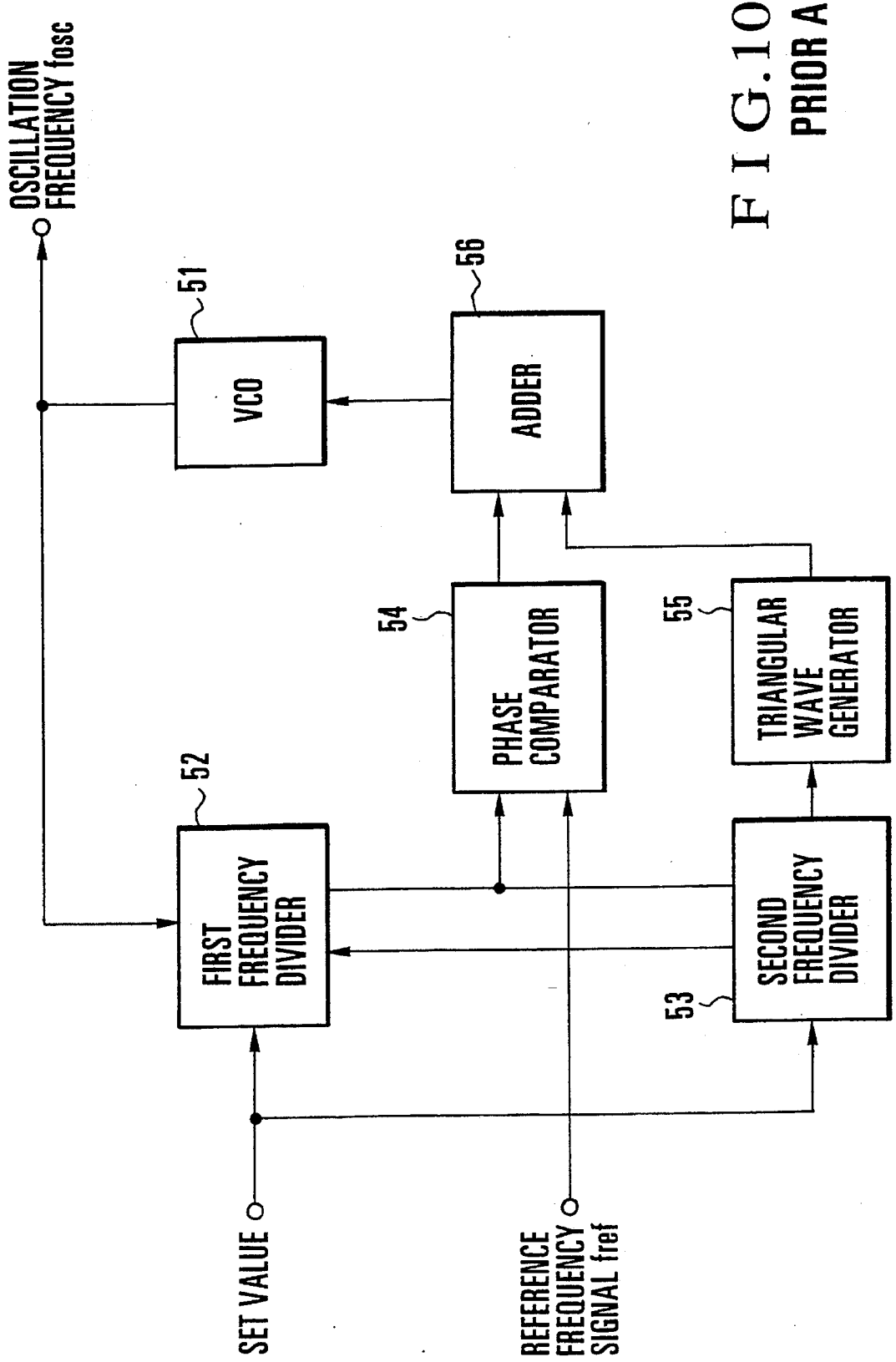
FIG. 10 is a block diagram showing another conventional PLL circuit.

In the PLL circuit of this embodiment, the means for generating the time series pulse strings (b) to (e) arranged in a staggered form is realized by the shift register 13 connected to the output side of the main counter 12. As is apparent, however, this means can easily be realized by using decoders 29 to 33 connected to the output side of the main counter 12, as shown in FIG. 8. More specifically, the count value of the main counter 12 is decoded by the respective decoders 29 to 33 in synchronism with the output (x) from the pre-scaler 11.

According to the present invention, there is provided a PLL circuit which frequency-divides an oscillation frequency signal, generates a plurality of time series pulse strings on the basis of the frequency-divided signal, filters a phase error signal obtained by obtaining the phase differences between the time series pulse strings and a reference frequency signal, and outputs the resultant signal to a variable frequency oscillation means, thereby obtaining a stable oscillation frequency with a small frequency step interval without decreasing the reference frequency.

What is claimed is:

1. A phase-locked loop circuit comprising:

voltage-controlled oscillation means whose oscillation frequency is controlled on the basis of phase different information;

first frequency division means for frequency-dividing an oscillation frequency output from said voltage-controlled oscillation means by one of frequency division ratios of $1/j$ (j is a positive integer) and $1/(j+1)$ which is selected in accordance with an external control signal;

second frequency division means for frequency-dividing a frequency division output from said first frequency dividing means by a frequency division ratio of n (n is a positive integer);

pulse string generating means for generating $\alpha$ ($\alpha$ is an integer equal to or larger than two) time series pulse strings which are synchronized with the output from said first frequency division means and have phases sequentially delayed by one period on the basis of a frequency division output from said second frequency division means; and phase comparison means for detecting phase differences between the $\alpha$ time series pulse strings from said pulse string generating means and a predetermined reference frequency signal, adding/synthesizing the detected phase differences., and outputting the resultant information as phase difference information to said voltage-controlled oscillation means.

2. A circuit according to claim 1, wherein said phase comparison means comprises:

first to $\alpha$th flip-flops for respectively receiving the $\alpha$ time series pulse strings from said pulse string generating means as set inputs;

a $(\alpha+1)$th flip-flop for receiving the reference frequency signal as a set input;

reset means for resetting said first to $(\alpha+1)$th flip-flops in response to set states of all the first to $(\alpha+1)$th flip-flops;

quantity-of-electricity generating means for generating $(\alpha+1)$ quantities of electricity proportional to set times of said first to $(\alpha+1)$th flip-flops; and output means for adding, synthesizing the $(\alpha+1)$ quantities of electricity from said quantity-of-electricity generating means and outputting the resultant information as phase difference information.

3. A circuit according to claim 2, wherein said quantity-of-electricity generating means includes current generating means for generating a current value per predetermined unit interval during each of set intervals of said first to $(\alpha+1)$th flip-flops.

4. A circuit according to claim 1, wherein said pulse string generating means comprises $\alpha$ shift registers for receiving the frequency division output from said second frequency division means, sequentially shifting the frequency division output by using the frequency division output from said first frequency division means, and outputting parallel outputs as $\alpha$ time series pulse strings.

5. A circuit according to claim 1, wherein said pulse string generating means comprises $\alpha$ decoders for receiving the frequency division output from said second frequency division means, and respectively outputting pulses constituting time series pulse strings upon reception of the frequency division output from said second frequency division means by predetermined values which are different from each other.

6. A circuit according to claim 1, further comprising control means for generating an external control signal for causing said first frequency division means to perform a $(j+1)$-frequency-dividing operation at least m times (m is a positive integer smaller than n) and j-frequency-dividing operation by the remaining number of times while said second frequency division means performs n-frequency division once.

7. A circuit according to claim 6, wherein said first and second frequency division means perform a $(jn+m+1+p/\alpha)$-frequency-dividing operation (p is an integer ranging from 0 to $(\alpha-1)$) as a whole.

8. A circuit according to claim 7, wherein the values p, n, and m can be arbitrarily set externally.

9. A circuit according to claim 6, wherein said control means generates an external control signal for causing said first frequency division means to perform a $(j+1)$-frequency-dividing operation $(m+1)$ times and a j-frequency-dividing operation $(n-m-1)$ times during a first n-frequency division interval of said second frequency division means, and causing said first frequency division means to perform a $(j+1)$-frequency-dividing operation $(m+2)$ times and a j-frequency-dividing operation $(n-m-2)$ times during a second n-frequency division interval of said second frequency division means.

10. A circuit according to claim 9, wherein the interval in which said second frequency division means performs n-frequency division $\alpha$ times is constituted by one first n-frequency division interval and $(\alpha-1)$ second n-frequency division intervals.

11. A phase-locked loop circuit comprising:

voltage-controlled oscillation means whose oscillation frequency is controlled on the basis of phase difference information;

first frequency division means for frequency-dividing an oscillation frequency output from said voltage-controlled oscillation means by one of frequency division ratios of $1/j$ (j is a positive integer) and $1/(j+1)$ which is selected in accordance with an external control signal;

second frequency division means for frequency-dividing a frequency division output from said first frequency dividing means by a frequency division ratio of n (n is a positive integer);

pulse string generating means for generating α (α is an integer equal to or larger than two) time series pulse strings which are synchronized with the output from said first frequency division means and have phases sequentially delayed by one period on the basis of a frequency division output from said second frequency division means;

first to αth flip-flops for respectively receiving the α time series pulse strings from said pulse string generating means as set inputs;

a (α+1)th flip-flop for receiving the reference frequency signal as a set input;

reset means for resetting said first to (α+1)th flip-flops in response to set states of all the first to (α+1)th flip-flops;

quantity-of-electricity generating means for generating (α+1) quantities of electricity proportional to set times of said first to (α+1)th flip-flops;

output means for adding, synthesizing the (α+1) quantities of electricity from said quantity-of-electricity generating means and outputting the resultant information as phase difference information; and control means for generating an external control signal for causing said first frequency division means to perform a (j+1)-frequency-dividing operation (m+1) times and a j-frequency-dividing operation (n−m−1) times during a first n-frequency division interval of said second frequency division means, and causing said first frequency division means to perform a (j+1)-frequency-dividing operation (m+2) times and a j-frequency-dividing operation (n−m−2) times during a second n-frequency division interval of said second frequency division means.

12. A phase-locked loop circuit comprising:

voltage-controlled oscillator whose oscillation frequency is controlled on the basis of phase difference information;

first frequency divider for frequency-dividing an oscillation frequency output from said voltage-controlled oscillation means by one of frequency division ratios of 1/j (j is a positive integer) and 1/(j+1) which is selected in Accordance with an external control signal;

second frequency divider for frequency-dividing a frequency division output from said first frequency divider by a frequency division ratio of n (n is a positive integer);

pulse string generator for generating α (α is an integer equal to or larger than two) time series pulse strings which are synchronized with the output from said first frequency divider and have phases sequentially delayed by one period on the basis of a frequency division output from said second frequency divider; and phase comparator for detecting phase differences between the α time series pulse strings from said pulse string generator and a predetermined reference frequency signal, adding/synthesizing the detected phase differences, and outputting the resultant information as phase difference information to said voltage-controlled oscillator.

13. A phase-locked loop circuit comprising:

voltage-controlled oscillator whose oscillation frequency is controlled on the basis of phase difference information;

first frequency divider for frequency-dividing an oscillation frequency output from said voltage-controlled oscillator by one of frequency division ratios of 1/j (j is a positive integer) and 1/(j+1) which is selected in accordance with an external control signal;

second frequency divider for frequency-dividing a frequency division output from said first frequency divider by a frequency division ratio of n (n is a positive integer);

pulse string generator for generating α (α is an integer equal to or larger than two) time series pulse strings which are synchronized with the output from said first frequency divider and have phases sequentially delayed by one period on the basis of a frequency division output from said second frequency divider;

first to αth flip-flops for respectively receiving the α time series pulse strings from said pulse string generator as set inputs;

a (α+1)th flip-flop for receiving the reference frequency signal as a set input;

reset device for resetting said first to (α+1)th flip-flops in response to set states of all the first to (α+1)th flip-flops;

quantity-of-electricity generator for generating (α+1) quantities of electricity proportional to set times of said first to (α+1)th flip-flops;

output device for adding, synthesizing the (α+1) quantities of electricity from said quantity-of-electricity generator and outputting the resultant information as phase difference information; and control device for generating an external control signal for causing said first frequency divider to perform a (j+1)-frequency-dividing operation (m+1) times and a j-frequency-dividing operation (n−m−1) times during a first n-frequency division interval of said second frequency divider, and causing said first frequency divider to perform a (j+1)-frequency-dividing operation (m+2) times and a j-frequency-dividing operation (n−m−2) times during a second n-frequency division interval of said second frequency divider.

* * * * *